United States Patent
Liu et al.

(10) Patent No.: US 8,704,695 B2
(45) Date of Patent: Apr. 22, 2014

(54) ANALOG-TO-DIGITAL CONVERTER

(71) Applicant: Sitronix Technology Corp., Jhubei (TW)

(72) Inventors: Ming-Huang Liu, Hsinchu County (TW); Wei-Yang Ou, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 13/682,907

(22) Filed: Nov. 21, 2012

(65) Prior Publication Data
US 2013/0135132 A1 May 30, 2013

(30) Foreign Application Priority Data

Nov. 30, 2011 (TW) .............................. 100144075 A

(51) Int. Cl.
*H03M 1/50* (2006.01)
(52) U.S. Cl.
USPC .......................... 341/166; 341/158; 341/165
(58) Field of Classification Search
None
See application file for complete search history.

(56) References Cited

U.S. PATENT DOCUMENTS

| | | | | |
|---|---|---|---|---|
| 4,763,197 A * | 8/1988 | Masuda | ........................ | 348/245 |
| 5,400,025 A * | 3/1995 | Pfeiffer | ........................ | 341/119 |
| 6,529,237 B1 * | 3/2003 | Tsay et al. | .................... | 348/241 |
| 7,095,355 B1 * | 8/2006 | Graham et al. | ............... | 341/169 |
| 8,264,394 B2 * | 9/2012 | Liu | ............................... | 341/166 |
| 2011/0309235 A1 * | 12/2011 | Yoshida | ........................ | 341/158 |

* cited by examiner

*Primary Examiner* — Howard Williams
(74) *Attorney, Agent, or Firm* — Rosenberg, Klein & Lee

(57) ABSTRACT

The present invention provides an analog-to-digital converter, which comprises an integration circuit, a threshold signal generating circuit, a main comparison circuit, a sub comparison circuit, a counter, and a decoder. The integration circuit integrates an input signal and produces an integration signal. The threshold signal generating circuit generates a main threshold signal and a plurality of sub threshold signals. The main comparison circuit produces a plurality of main comparison signals according the integration signal and the main threshold signal. The sub comparison circuit produces a plurality of sub comparison signals according to the integration signal and the plurality of sub threshold signals. The counter counts the plurality of main comparison signals and produces a first counting signal. The decoder decodes the plurality of sub comparison signals and produces a second count signal. The first count signal and the second count signal are used for producing a digital signal.

12 Claims, 4 Drawing Sheets

ANALOG-TO-DIGITAL CONVERTER

FIELD OF THE INVENTION

The present invention relates generally to a converter, and particularly to an analog-to-digital converter used for reducing integral non-linearity and hence improving the accuracy.

BACKGROUND OF THE INVENTION

Many electronic devices need to convert the various physical phenomena in the real-world environment, which are analog signals, to digital signals that can be processed by microprocessors for facilitating input processing. Sometimes the results processed and output by microprocessors also need to be converted to analog signals for subsequent applications. The former process is called analog-to-digital conversion (ADC), while the latter, digital-to-analog conversion (DAC). The ADC technologies can be categorized into integrative and comparative methods. The integrative methods are further categorized into the single-slope ADC and the dual-slope ADC; the comparative methods are further categorized into the counting ADC, the successive-approximation ADC, and the parallel-comparator ADC. These ADC circuits have their advantages and disadvantage, respectively. In general, it depends on the application scenarios for choosing the method.

There is an integration circuit in a general analog-to-digital converter. As shown in FIG. 1, an input signal $I_{IN}$ is integrated by an integration circuit comprising a capacitor C and an operational amplifier 12 for producing an integration signal at the output D of the operational amplifier 12. As shown in FIG. 2, this integration signal is a triangle-wave signal. A comparator 14 compares the integration signal to a reference signal Vref. If the integration signal is equal to or greater than the reference signal Vref, a comparison signal is produced. Thereby, the number of the comparison signal represents the number of the triangle-wave signal (the integration signal). A counter 16 is coupled to the output of the comparator 14 for counting the number of the comparison signal, namely, counting the number of the triangle-wave signal, for producing digital signals. Each comparison signal is further used as a reset signal $RST_1$ for resetting the integration circuit and for re-integrating the input signal $I_{IN}$ and producing the integration signal. In other words, the next triangle-wave signal can be produced.

It is known from above that each time the comparator 14 compares the integration signal and the reference signal Vref and produces a comparison signal, the integration circuit has to be reset for producing the next integration signal. Thereby, for a 12-bit analog-to-digital converter, the counter 16 needs to count for 4095 times at most, and hence resetting the integration circuit for 4095 times at most as well. When the integration circuit according to the prior art is reset, the integral nonlinearity (INL) will be produced and accumulated. Consequently, this INL increases as the number of resets on the integration circuit increases and thus reducing the accuracy of the analog-to-digital converter. Thereby, how to reduce the INL has become a major subject currently in developing analog-to-digital converters.

Accordingly, the present invention provides an analog-to-digital converter, which can reduce the number of times for which the integration circuit is reset for reducing the INL. Hence, the accuracy of the analog-to-digital converter is enhanced and the problem described above can be solved.

SUMMARY

An objective of the present invention is to provide an analog-to-digital converter, which reduces the number of times for which the integration circuit is reset for reducing integral nonlinearity and improving the accuracy of the analog-to-digital converter.

The analog-to-digital converter comprises an integration circuit, a threshold signal generating circuit, a main comparison circuit, a sub comparison circuit, a counter, and a decoder. The integration circuit integrates an input signal and produces an integration signal. The threshold signal generating circuit generates a main threshold signal and a plurality of sub threshold signals. The main comparison circuit produces a plurality of main comparison signals according the integration signal and the main threshold signal. The sub comparison circuit produces a plurality of sub comparison signals according to the integration signal and the plurality of sub threshold signals. The counter counts the plurality of main comparison signals and produces a first counting signal. The decoder decodes the plurality of sub comparison signals and produces a second count signal. The first count signal and the second count signal are used for producing a digital signal. In addition, the present invention further comprises a latch used for latching the first and second count signals for producing the digital signal.

DETAILED DESCRIPTION

Figure 1:
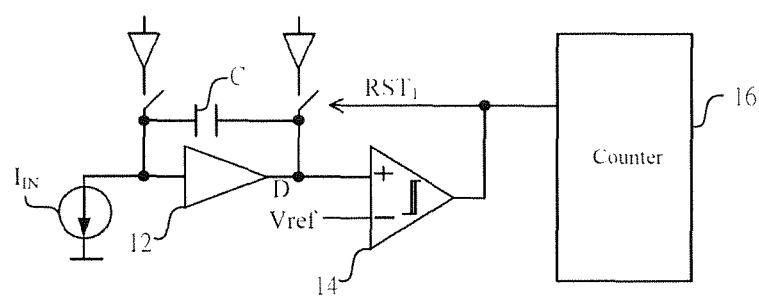
FIG. 1 shows a circuit diagram of the analog-to-digital converter according to the prior art.

In order to make the structure and characteristics as well as the effectiveness of the present invention to be further understood and recognized, the detailed description of the present invention is provided as follows along with embodiments and accompanying figures.

The analog-to-digital converter according to the present invention can be applied to any electronic device. In the following, the application of the analog-to-digital converter to a photo detecting device is used as an example. Nonetheless, the present invention is not limited to photo detecting devices only. First, refer to FIG. 3, which shows a circuit diagram of the analog-to-digital converter according to an embodiment of the present invention. As shown in the figure, the analog-to-digital converter according to the present invention comprises an integration circuit 20, a threshold signal generating circuit 30, a main comparison circuit 40, a sub comparison circuit 50, a counter 60, and a decoder 70. The integration circuit 20 receives and integrates an input signal $I_{IN}$ for producing an integration signal $V_T$. The input signal $I_{IN}$ according to the present embodiment is produced by a photo detector 18 detecting the light intensity of the environment. The intensity of the input signal $I_{IN}$ represents the light intensity of the environment. As shown in the figure, the photo detector 18 is coupled to the integration circuit 20 and provides the input signal $I_{IN}$ to the integration circuit 20. The input signal $I_{IN}$ according to the present invention can be produced by temperature sensors, pressure sensors, or other environmental sensors.

The threshold signal generating circuit 30 is coupled to the main comparison circuit 40 and the sub comparison circuit 50. The threshold signal generating circuit is coupled to a reference voltage $V_{REFP}$ and a reference level $V_{REFN}$ for producing a main threshold signal and a plurality of sub threshold signals $V_{TH}$ The levels of the plurality of sub threshold signals $V_{TH}$ are different. The main comparison circuit 40 is coupled to the integration circuit 20 and the threshold signal generating circuit 30 and compares the integration signal $V_I$ and the main threshold signal for producing a plurality of main comparison signals $V_{MAIN}$. In other words, the main comparison circuit 40 produces the plurality of main comparison signals $V_{MAIN}$ according to the integration signal $V_I$ and the main threshold signal. The sub comparison circuit 50 is coupled to the integration circuit 20 and the threshold signal generating circuit 30 for comparing the integration signal $V_I$ and the plurality of sub threshold signals $V_{TH}$ and producing a plurality of sub comparison signals $V_{SUB}$. Namely, the sub comparison circuit 50 produces the plurality of comparison signals $V_{SUB}$ according to the integration signal V, and the plurality of sub threshold signals $V_{TH}$.

According to the present embodiment, the main threshold signal is the difference ($V_{REFP}$–$V_{REFN}$) between the reference voltage $V_{REFP}$ and the reference level $V_{REFN}$. Thereby, the main comparison circuit 40 receives the reference voltage $V_{REFP}$ and the reference level $V_{REFN}$ of the threshold signal generating circuit 30 for comparing the reference voltage $V_{REFP}$ and the reference level $V_{REFN}$ first and giving the difference between the reference voltage $V_{REFP}$ and the reference level $V_{REFN}$. Then the main comparison circuit 40 further compares this difference with the integration signal $V_I$. In addition, the threshold signal generating circuit 30 according to the present invention can provide the difference between the reference voltage $V_{REFP}$ and the reference level $V_{REFN}$ directly. That is to say, the threshold signal generating circuit 30 can provide the main threshold signal to the main comparison circuit 40. Thus, the main comparison circuit 40 needs not to compare the reference voltage $V_{REFP}$ and the reference level $V_{REFN}$ first. The main threshold signal is the difference between the reference voltage $V_{REFP}$ and the reference level $V_{REFN}$, which is only an embodiment of the present invention. The main threshold signal can be determined according to requirements; it is not limited to the difference between the reference voltage $V_{REFP}$ and the reference level $V_{REFN}$.

Refer again to FIG. 3. When the integration signal $V_I$ is greater than the main threshold signal ($V_{REFP}$–$V_{REFN}$), the main comparison circuit 40 will produce the main comparison signal $V_{MAIN}$, which is used as a reset signal $RST_2$ for resetting the integration circuit 20, re-integrating the input signal, and producing the integration signal $V_I$ again. Thereby, the main comparison circuit 40 will compare the integration signal $V_I$ with the main threshold signal again for producing the main comparison signal $V_{MAIN}$ once more. The integration circuit 20 and the main comparison circuit 40 repeat the operations described above. Accordingly, the main comparison circuit 40 will produce a plurality of main comparison signals $V_{MAIN}$ according to the integration signal $V_I$ and the main threshold signal.

The counter 60 is coupled to the main comparison circuit 40 and counts the number of the plurality of main comparison signals $V_{MAIN}$ for producing a first counting signal $C_1$. The decoder 70 is coupled to the sub comparison circuit 50 and decodes the plurality of sub comparison signals $V_{SUB}$ for producing a second counting signal $C_2$. In addition, the present invention further comprises a latch 80 coupled to the counter 60 and the decoder 70 for latching the first and the second counting signals $C_1$, $C_2$ and producing a digital signal $S_D$ for subsequent circuits. In other words, the first and the second counting signals $C_1$, $C_2$ according to the present invention are used for producing the digital signal $S_D$.

Figure 3:
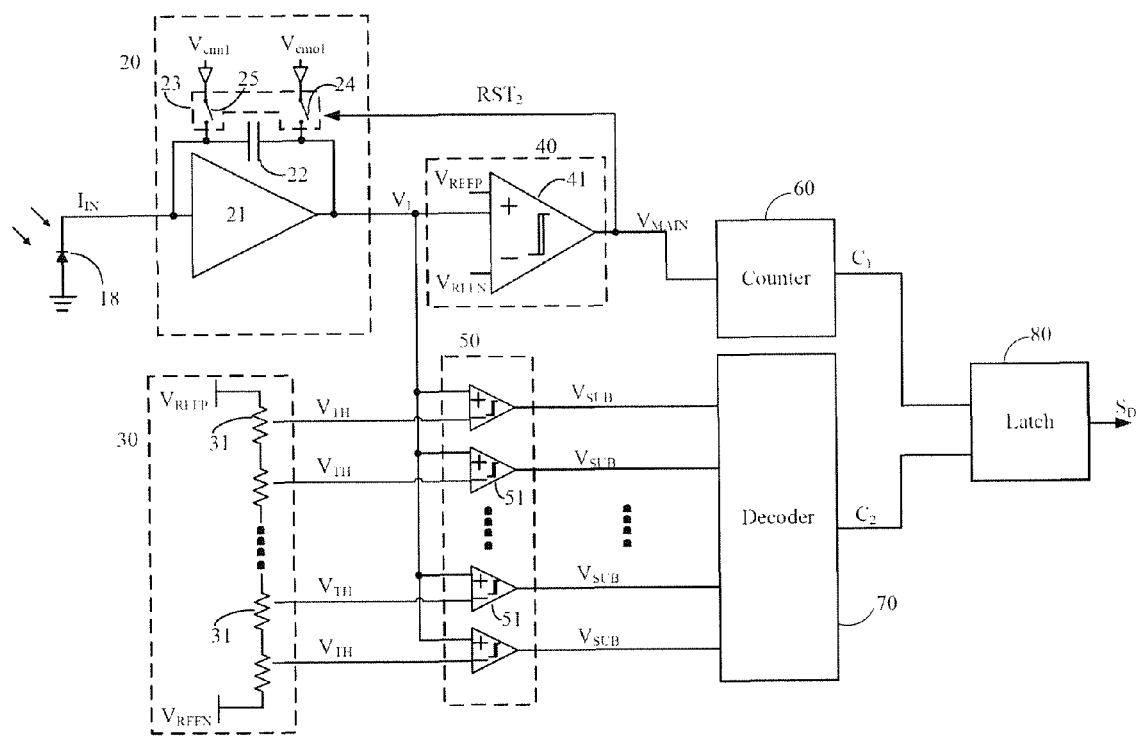
FIG. 3 shows a circuit diagram of the analog-to-digital converter according to an embodiment of the present invention.
Figure 4:
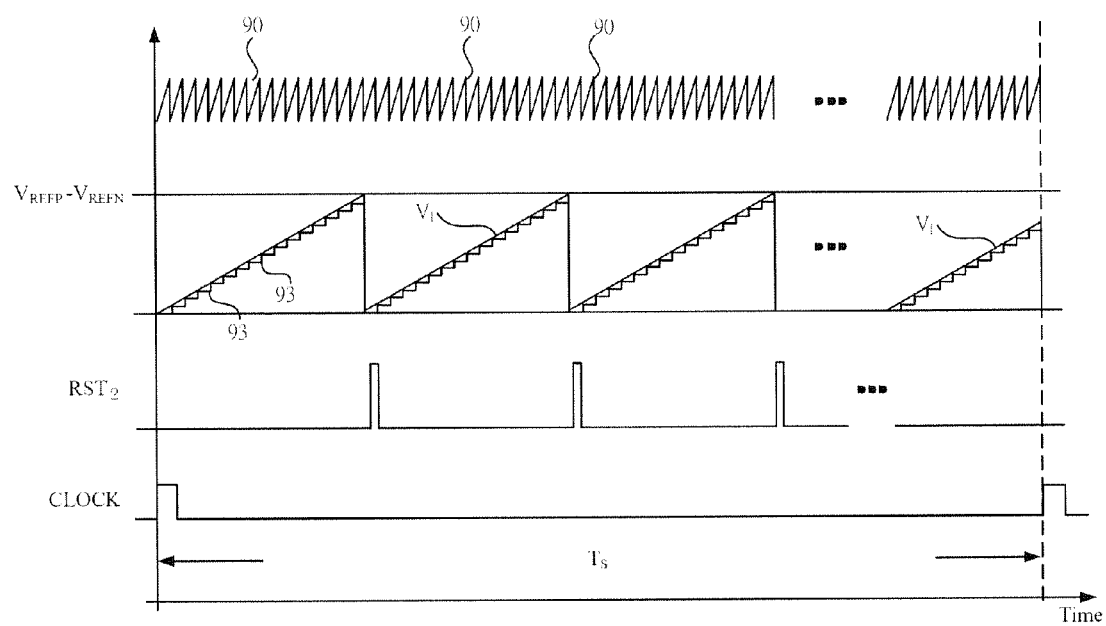
FIG. 4 shows waveforms of the analog-to-digital converter according to an embodiment of the present invention.

FIG. 4 shows waveforms of the analog-to-digital converter according to an embodiment of the present invention. As shown in the figure, the integration signal $V_I$ is a triangle signal. The main threshold signal ($V_{REFP}$–$V_{REFN}$) according to the present embodiment is the difference between the reference voltage $V_{REFP}$ and the reference level $V_{REFN}$. FIG. 4 shows the waveforms of a 12-bit analog-to-digital converter. In the following, the waveforms along with the circuit diagram in FIG. 3 are used for describing the operations of the analog-to-digital converter according to the present invention. The counter 60 according to the present embodiment is an 8-bit counter. Thereby, the first counting signal $C_1$ is an 8-bit signal. The sub comparison circuit 50 produces 16 sub comparison signals $V_{SUB}$. The decoder 70 decodes the 16 comparison signals $V_{SUB}$ and outputs the second counting signal $C_2$, which is a 4-bit signal. Hence, the 12-bit digital signal $S_D$ can be by means of the 8-bit first counting signal $C_1$ and the 4-bit second counting signal $C_2$. The latch 80 is a 12-bit latch used for latching the 8-bit first counting signal $C_1$ and the 4-bit second counting signal $C_1$ and producing the 12-bit digital signal $S_D$. The above description is only an embodiment of the present invention. The analog-to-digital converter according to the present invention is not limited to a 12-bit analog-to-digital converter.

Figure 2:
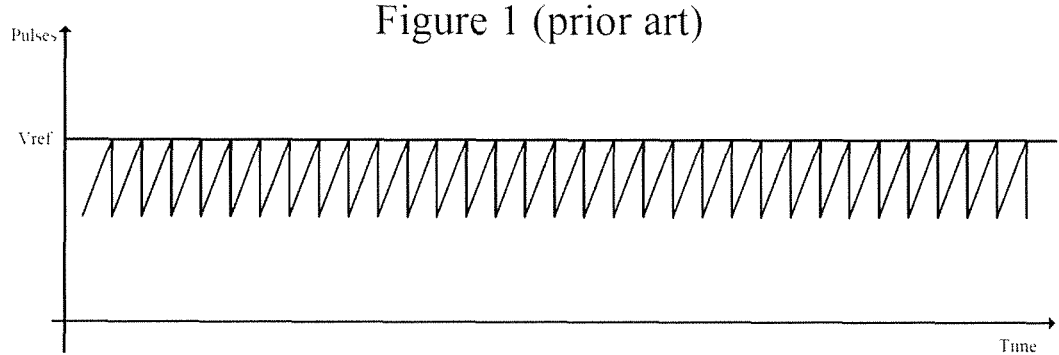
FIG. 2 shows a waveform of the analog-to-digital converter according to the prior art.

The main threshold signal ($V_{REFP}$–$V_{REFN}$) provided by the threshold signal generating circuit 30 according to the present invention is the difference between the reference voltage $V_{REFP}$ and the reference level $V_{REFN}$ of the threshold signal generating circuit 30. Thereby, the voltage level of the main threshold signal is high. The main comparison circuit 40 will not produce the reset signal for resetting the integration circuit 20 unless the integration signal is equal to or greater than the main threshold signal. Besides, the voltage level of the main threshold signal is higher than the voltage of the reference signal Vref of the analog-to-digital converter according to the prior art (refer to FIG. 2). Thereby, the voltage level of the integration signal $V_I$ according to the present invention is greater than the voltage level of the integration signal of the analog-to-digital converter according to the prior art. As shown in FIG. 4, the voltage level of the integration signal $V_I$ is higher than that of the small-triangle-wave signal 90, which is the integration signal according to the prior art as shown in FIG. 2. According to the present embodiment, an integration signal $V_I$ includes 16 small-triangle-wave signals 93. Namely, an integration signal $V_I$ includes 16 small-triangle-wave signals 90 equivalently.

It is known from the above description that an integration signal $V_I$ produced by the integration circuit 20 according to the present invention includes a plurality of small-triangle-wave signals 93. Thereby, an integration signal $V_I$ represents a plurality of small-triangle-wave signals 93. According to the present embodiment, an integration signal $V_I$ represents 16 small-triangle-wave signals 93. Taking the 12-bit analog-to-digital converter according to the prior art for example, its counter is a 12-bit counter used for counting the number of the small-triangle-wave signals 90 shown in FIG. 4. Within a conversion time $T_S$, the 12-bit counter can at most count for 4095 small-triangle-wave signals 90. In other words, the integration circuit of the 12-bit analog-to-digital converter according to the prior art may at most produce 4095 smalltriangle-wave signals 90 within a conversion time $T_S$, which means the integration circuit need to be reset for 4095 times. Nonetheless, the integration circuit 20 according to the present invention needs not to be reset for 4095 times. According to the present embodiment, an integration signal $V_I$ represents 16 small-triangle-wave signals 93. Hence, the integration circuit 20 at most produces 256 integration signals $V_I$ only, meaning that the main comparison circuit 40 at most produces 255 reset signals $RST_2$ only for resetting the integration circuit 20 according to the present invention for 255 times at most, which is only 1/16 of the rest times for the analog-to-digital converter according to the prior art. Thus, the reset times of the integration circuit as well as the integral nonlinearity can be reduced effectively. Accordingly, the accuracy of the analog-to-digital converter can be improved. The signal CLOCK shown in FIG. 4 is produced by the electronic device for controlling the conversion time $T_S$ of the analog-to-digital converter. This is a technology well known to a person having ordinary skill in the art. Hence, the details will not be discussed here.

The voltage levels of the plurality of sub threshold signals $V_{TH}$ generated by threshold signal generating circuit 30 are different. Besides, the levels of the plurality of sub threshold signals $V_{TH}$ correspond to those of the plurality of small-triangle-wave signals 93. The maximum voltage level of the plurality of sub threshold signals $V_{TH}$ is equal to that of the main threshold signal. According to the present embodiment, because an integration signal $V_I$ includes 16 small-triangle-wave signals 93, the threshold signal generating circuit 30 generates 16 sub threshold signals $V_{TH}$.

The sub comparison circuit 50 compares the integration signal $V_I$ and the plurality of sub threshold signals $V_{TH}$ and produces a plurality of sub comparison signals $V_{SUB}$. According to the present embodiment, when the integration signal $V_I$ is greater than the sub threshold signals $V_{TH}$, the voltage level of the sub comparison signal $V_{SUB}$ is high. For example, if the integration signal $V_I$ is greater than the first, the second, and the third sub threshold signals $V_{TH}$ and smaller than the fourth sub threshold signals $V_{TH}$, then the voltage levels of the first, the second, and the third sub threshold signals $V_{TH}$ are high while the level of the fourth sub threshold signals $V_{TH}$ is low. By means of the plurality of sub comparison signals $V_{SUB}$, the voltage level of the integration signal $V_I$ smaller than the main threshold signal can be judges. In other words, the level of the last integration signal $V_I$ can be judged for further judging how many small-triangle-wave signals 93 the last integration signal $V_I$ contains. For instance, if the voltage levels of the first, the second, and the third sub comparison signals $V_{SUB}$ are high while that of the fourth sub comparison signal $V_{SUB}$ is low, it means that the integration signal is greater than the first, the second, and the third sub threshold signals $V_{TH}$ and smaller than the fourth sub threshold signals $V_{TH}$. Hence, the last integration signal $V_I$ contains 3 small-triangle-wave signals 93.

The decoder 70 decodes the plurality of sub comparison signals $V_{SUB}$ and produces the second counting signal $C_2$. Namely, the decoder 70 converts the plurality of sub comparison signals $V_{SUB}$ to the second counting signal $C_2$. According to the present embodiment, the second counting signal $C_2$ is a 4-bit signal. For example, if the voltage levels of the first, the second, and the third sub comparison signals $V_{SUB}$ are high while those of the fourth to the sixteenth sub comparison signals $V_{SUB}$ are low, then the second counting signal $C_2$ output by the decoder 70 is 0011, which means that the integration signal contains 3 small-triangle-wave signals 93. According to the present embodiment, if the voltage levels of the first to the sixteenth sub comparison signals $V_{SUB}$ are high, then the second counting signal $C_2$ output by the decoder 70 is 0000.

The latch 80 is coupled to the counter 60 and the decoder 70 for receiving and latching the first and the second counting signals $C_1, C_2$ and producing the digital signal $S_D$. According to the present embodiment, the first counting signal $C_1$ is the fifth to the twelfth bits of the digital signal $S_D$, while the second counting signal $C_2$ is the first to the fourth bits of the digital signal $S_D$. For example, the first counting signal $C_1$ is 01001010; the second counting signal $C_2$ is 0011; and the digital signal $S_D$ is 010010100011.

Accordingly, the first counter 60 is used for counting the number of the complete integration signal $V_I$, the voltage level of which is equal to or greater than the main threshold signal. The sub comparison circuit 50 is used for giving the voltage level of the incomplete integration signal $V_I$, the voltage level of which is smaller than the main threshold signal. Then the sub comparison circuit 50 is used for giving the voltage level of the last integration signal $V_I$. The decoder 70 is used for quantifying the voltage level of the last integration signal $V_I$ and producing the second counting signal $C_2$ according to the plurality of sub comparison signals $V_{SUB}$ of the sub comparison circuit 50. The second counting signal $C_2$ represents equivalently the number of the small-triangle-wave signals 93 contained in the last integration signal $V_I$.

By means of the first counting signal $C_1$ of the first counter 60 and the second counting signal $C_2$ of the decoder 70, the number of the incomplete integration signal $V_I$ within the conversion time $T_S$ and the voltage level of the incomplete integration signal $V_I$ can be given. Thereby, the total number of the small-triangle-wave signals 93 contained in all integration signals $V_I$, including the complete integration signal $V_I$ and the last integration signal $V_I$, can be given. Namely, the digital signal $S_D$ produced according to the first and the second counting signals $C_1, C_2$ represents the total number of the small-triangle-wave signals 93 contained in all integration signals $V_I$ within the conversion time $T_S$. Thereby, the analog input signal $I_{IN}$ is converted to the digital signal $S_D$. according to the present embodiment, the analog-to-digital converter first converts the input signal $I_{IN}$ produced by the photo detector 18 to the digital signal $S_D$, which represents the light intensity of the environment.

Refer again to FIG. 3. The integration circuit 20 comprises an operational amplifier 21, a first capacitor 22, a first switch module 23, and two discharging terminals $V_{cmo1}, V_{cmi1}$. The operational amplifier 21 is coupled to the photo detector 18 and receives the input signal $I_{IN}$. The first capacitor 22 is connected in parallel with the operational amplifier 21 for producing the integration signal $V_I$. The first switch module 23 includes a plurality of switches 24, 25 connected between both terminals of the first capacitor 22 and the two discharging terminals $V_{cmo1}, V_{cmi1}$ and controlled by the reset signal $RST_2$ of the main comparison circuit 40 for discharging the first capacitor 22 and resetting the integration circuit 20. The switch 24 is coupled between a terminal of the first capacitor 22 and a first discharging terminal $V_{cmo1}$ while the switch 25 is coupled between the other terminal of the first capacitor 22 and a second discharging terminal $V_{cmi1}$. The switches 24, 25 are controlled by the reset signal $RST_2$.

The threshold signal generating circuit 30 is a voltage dividing circuit comprising a plurality of resistors 31. The plurality of resistors 31 are connected in series. The threshold signal generating circuit 30 is coupled to the main comparison circuit 40 and the sub comparison circuit and produces the main threshold signal ($V_{REFP} - V_{REFN}$) and a plurality of sub threshold signals $V_{TH}$. The main comparison circuit 40 includes a main comparator 41, which is coupled to the integration circuit 20 and the threshold signal generating circuit 30 and compares the integration signal $V_I$ with the main threshold signal for producing the main comparison signal $V_{MAIN}$. In other words, the main comparison signal $V_{MAIN}$ is produced according to the integration signal $V_I$ and the main threshold signal. According to the present embodiment, the main comparator 41 can be a hysteresis comparator.

The sub comparison circuit 50 includes a plurality of sub comparators 51. Each sub comparator 51 is coupled to the threshold signal generating circuit 30 and the integration circuit 20, respectively. Thereby, the sub comparison circuit 50 and the main comparison circuit 40 receive the same integration signal $V_I$ and the plurality of sub threshold signals $V_{TH}$ generated by the threshold signal generating circuit 30 for comparing the integration signal $V_I$ with the plurality of sub threshold signals $V_{TH}$ and producing the plurality of sub comparison signals $V_{SUB}$. Namely, the sub comparison circuit 50 produces the plurality of sub comparison signals $V_{SUB}$ according to the integration signal $V_I$ and the plurality of sub threshold signals $V_{TH}$. According to an embodiment of the present invention, the plurality of sub comparators 51 can be hysteresis comparators. The number of the plurality of sub comparators 51 is equal to the number of the small-triangle-wave signals 93 contained in the integration signal $V_I$. According to the present embodiment, the sub comparison circuits 50 contains 16 sub comparators 51.

An embodiment of the threshold signal generating circuit 30 according to the present invention is a voltage dividing circuit. Nonetheless, the threshold signal generating circuit 30 can be a current source, a voltage source, or other signal generating circuits; it is not limited to a voltage dividing circuit. In addition to comparators, the main comparison circuit 40 and the sub comparator 50 can be implemented by using other electronic devices as well.

By using the integration circuit 20, the threshold signal generating circuit 30, the main comparison circuit 40, the sub comparison circuit 50, the counter 60, and the decoder 70 described above, the analog-to-digital converter according to the present invention reduces the number of times for which the integration circuit 20 is reset and thus reducing the integral nonlinearity and improving the accuracy of the analog-to-digital converter. That is to say, the digital signal $S_D$ produced according to the present invention owns the property of high accuracy. Besides, the integration circuit 20, the threshold signal generating circuit 30, the main comparison circuit 40, and the sub comparison circuit 50 described above can be designed according to requirements; they are not limited to the embodiments described above.

Figure 5:
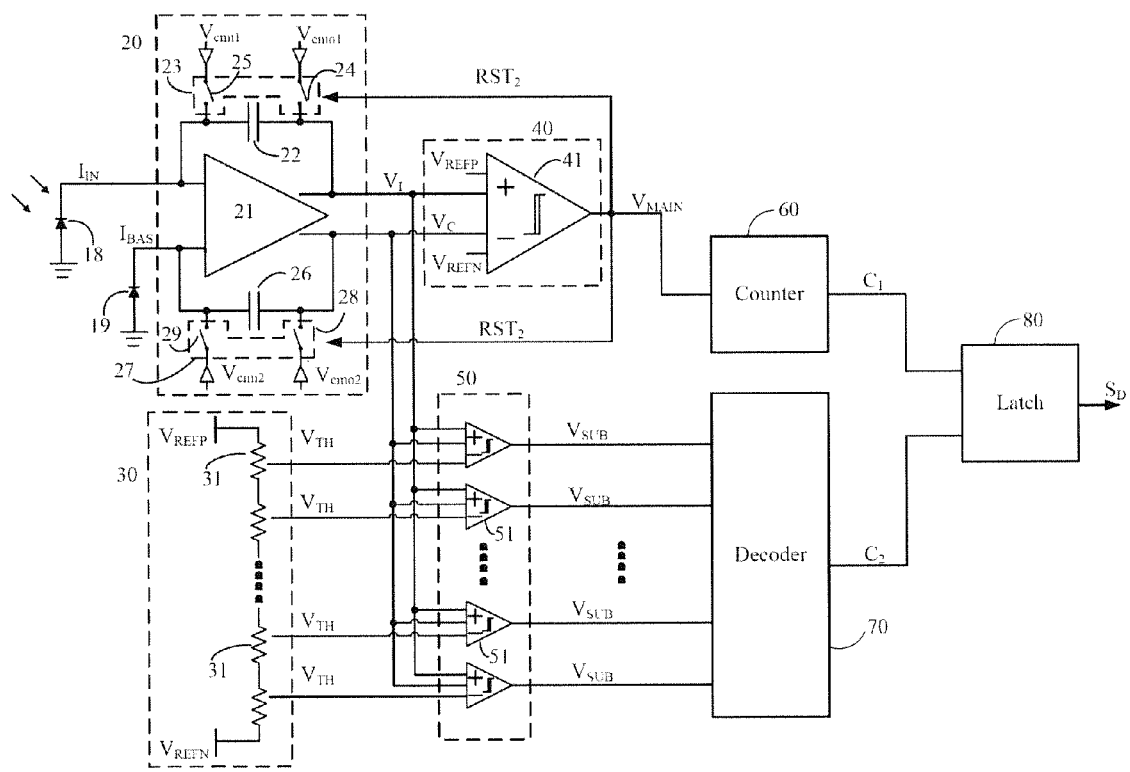
FIG. 5 shows a circuit diagram of the analog-to-digital converter according to another embodiment of the present invention.

FIG. 5 shows a circuit diagram of the analog-to-digital converter according to another embodiment of the present invention. The integration circuit 20 of the analog-to-digital converter in FIG. 5 is further coupled to a reference photo detector 19. Besides, the integration circuit is adjusted because of the reference photo detector 19. Namely, the integration circuit 20 in FIG. 5 comprises an operational amplifier 21, a first capacitor 22, a first switch module 23, a first discharging terminal $V_{cmo1}$, a second discharging terminal $V_{cmi1}$, a second capacitor 26, a second switch module 27, a third discharging terminal $V_{cmo2}$, and a fourth discharging terminal $V_{cmi2}$. The operational amplifier 21 receives the input signal $I_{IN}$ and a baseline signal $I_{BAS}$. The baseline signal $I_{BAS}$ is produced by the reference photo detector 19.

The first capacitor 22 is connected in parallel on one side of the operational amplifier 21 for producing the integration signal $V_I$; the second capacitor 26 is connected on the other side of the operational amplifier 21 for producing a correction signal $V_C$. The integration signal $V_I$ corresponds to the input signal $I_{IN}$; the correction signal $V_C$ corresponds to the baseline signal $I_{BAS}$. The first switch module 23 includes the switches 24, 25 and is connected between a terminal of the first capacitor 22 and the first discharging terminal $V_{cmo1}$ and between the other terminal of the first capacitor 22 and the second discharging terminal $V_{cmi1}$. In addition, the switches 24, 25 are controlled by the main comparison circuit 40. The second switch module 27 includes a plurality of switches 28, 29. The switch 28 is connected between a terminal of the second capacitor 26 and the third discharging terminal $V_{cmo2}$, while the switch 29 is connected between the other terminal of the second capacitor 26 and the fourth terminal $V_{cmi2}$. The switches 28, 29 are controlled by the reset signal $RST_2$ produced by the main comparison circuit 40 for discharging the second capacitor 26.

Theoretically, the photo detector 18 should not produce any input signal $I_{IN}$ without light. Nonetheless, in practice, the photo detector 18 still can possibly produce the input signal $I_{IN}$ with a low voltage level without detecting any light. Thereby, according to the present invention, the reference photo detector 19 is used for producing the baseline signal in the relatively dark condition. Then the operational amplifier 21 of the integration circuit 20 and the second capacitor 26 integrate the baseline signal $I_{BAS}$ and produces the correction signal $V_C$.

The integration signal $V_I$ of the first capacitor 22 and the correction signal $V_C$ of the second capacitor will be transmitted to the main comparison circuit 40. The main comparator 41 of the main comparison circuit 40 will compare the integration signal $V_I$ with the correction signal first $V_C$. Then a difference between the integration signal $V_I$ and the correction signal first $V_C$ is compared with the main threshold signal $(V_{REFP}-V_{REFN})$ of the threshold signal generating circuit 30 for producing the plurality of main comparison signals $V_{MAIN}$. In other words, the main comparison circuit 40 produces the plurality of main comparison signals $V_{MAIN}$ according to the integration signal $V_I$, the correction signal $V_C$, and the main threshold signal. Because the main comparison circuit 40 corrects the integration signal $V_I$ and then compares it with the main threshold signal based on the baseline signal $I_{BAS}$ of the reference photo detector 19, the detecting accuracy of the photo detector can be enhanced.

Like the description above, the integration circuit 20 also provides the correction signal $V_C$ to the sub comparison circuit 50. The plurality of sub comparators 51 of the sub comparison circuit 50 first compare the integration signal $V_I$ with the correction signal $V_C$. Then the difference between the integration signal $V_I$ and the correction signal $V_C$ is compared to the plurality of sub threshold signals $V_{TH}$ of the threshold signal generating circuit 30 for producing the plurality of sub comparison signals $V_{SUB}$. Namely, the sub comparison circuit 50 produces the plurality of sub comparison signals $V_{SUB}$ according to the integration signal $V_I$, the correction signal $V_C$, and the plurality of sub threshold signals $V_{TH}$.

To sum up, the present invention provides an analog-to-digital converter, which comprises an integration circuit, a threshold signal generating circuit, a main comparison circuit, a sub comparison circuit, a counter, and a decoder. The integration circuit integrates an input signal and produces an integration signal. The threshold signal generating circuit generates a main threshold signal and a plurality of sub threshold signals. The main comparison circuit produces a plurality of main comparison signals according the integration signal and the main threshold signal. The sub comparison circuit produces a plurality of sub comparison signals according to the integration signal and the plurality of sub threshold signals. The counter counts the plurality of main comparison signals and produces a first counting signal. The decoder decodes the plurality of sub comparison signals and produces a second count signal. The first count signal and the second count signal are used for producing a digital signal. The analog-to-digital converter according to the present invention can reduce the number of time for which the integration circuit is reset and thus reducing the integral nonlinearity and improving the accuracy of the analog-to-digital converter.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An analog-to-digital converter, comprising:
   an integration circuit, integrating an input signal for producing an integration signal;
   a threshold signal generating circuit, generating a main threshold signal and a plurality of sub threshold signals;
   a main comparison circuit, producing a plurality of main comparison signals according to said integration signal and said main threshold signal;
   a sub comparison circuit, producing a plurality of sub comparison signals according to said integration signal and said plurality of sub threshold signals;
   a counter, counting said plurality of main comparison signals for producing a first counting signal; and
   a decoder, decoding said plurality of sub comparison signals for producing a second counting signal;
   where said first counting signal and said second counting signal are used for producing a digital signal.

2. The analog-to-digital converter of claim 1, and further comprising:
   a latch, latching said first counting signal and said second counting signal for producing said digital signal.

3. The analog-to-digital converter of claim 1, wherein said main comparison circuit compares said integration signal with said main threshold signal for producing said plurality of main comparison signals and said sub comparison circuits compares said integration signal with said plurality of sub threshold signals for producing said plurality of sub comparison signals.

4. The analog-to-digital converter of claim 1, wherein said integration circuit comprises:
   an operational amplifier, receiving said input signal;
   a capacitor, connected in parallel with said operational amplifier for producing said integration signal; and
   a switch module, connected between the two terminal of said capacitor and two discharging terminals, and controlled by said main comparison circuit.

5. The analog-to-digital converter of claim 1, wherein said integration circuit further integrates a baseline signal for producing a correction signal; said main comparison circuit produces said plurality of main comparison signals according to said integration signal, said correction signal, and said main threshold signal; and said sub comparison circuit produces said plurality of comparison signals according to said integration signal, said correction signal, and said plurality of sub threshold signals.

6. The analog-to-digital converter of claim 5, wherein said main comparison circuit compares a difference between said integration signal and said correction signal with said main threshold signal for producing said plurality of main comparison signals, and said sub comparison circuit compares said difference between said integration signal and said correction signal with said plurality of sub threshold signals for producing said plurality of sub comparison signals.

7. The analog-to-digital converter of claim 5, wherein said integration circuit further comprises:
   an operational amplifier, receiving said input signal and said baseline signal;
   a first capacitor, connected in parallel on one side of said operational amplifier for producing said integration signal;
   a second capacitor, connected in parallel on the other side of said operational amplifier for producing said correction signal;
   a first switch module, connected between one terminal of said first capacitor and a first discharging terminal and between the other terminal of said first capacitor and a second discharging terminal, and controlled by said main comparison circuit; and
   a second switch module, connected between one terminal of said second capacitor and a third discharging terminal and between the other terminal of said second capacitor and a fourth discharging terminal, and controlled by said main comparison circuit.

8. The analog-to-digital converter of claim 1, wherein said threshold signal generating circuit is a voltage dividing circuit.

9. The analog-to-digital converter of claim 1, wherein said plurality of main comparison signals produced by said main comparison circuit are used for resetting said integration circuit and for re-integrating said input signal and producing said integration signal.

10. The analog-to-digital converter of claim 1, wherein said sub comparison circuit further comprises:
    a plurality of sub comparators, producing said plurality of sub comparison signal according to said integration signal and said plurality of sub threshold signals for producing said digital signal.

11. The analog-to-digital converter of claim 10, wherein said main comparison circuit comprises a main comparator producing said plurality of main comparison signals according to said integration signal and said main threshold signal, and said main comparator and said plurality of sub comparators are hysteresis comparators.

12. The analog-to-digital converter of claim 1, wherein the voltage level of said main threshold signal is equal to the maximum voltage level of said plurality of sub threshold signals.

* * * * *